United States Patent
Cho et al.

(10) Patent No.: US 7,949,062 B2
(45) Date of Patent: May 24, 2011

(54) ENCODING SYSTEM USING A NON-BINARY TURBO CODE AND AN ENCODING METHOD THEREOF

(75) Inventors: Seong-Chul Cho, Daejeon (KR); Gweon-Do Jo, Daejeon (KR); Hyung-Jin Kim, Daejeon (KR); Jin-Up Kim, Daejeon (KR); Sang-Woo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 1016 days.

(21) Appl. No.: 11/792,712

(22) PCT Filed: Nov. 9, 2005

(86) PCT No.: PCT/KR2005/003785
§ 371 (c)(1),
(2), (4) Date: Jun. 11, 2007

(87) PCT Pub. No.: WO2006/062296
PCT Pub. Date: Jun. 15, 2006

(65) Prior Publication Data
US 2008/0043856 A1   Feb. 21, 2008

(30) Foreign Application Priority Data

Dec. 11, 2004  (KR) .................. 10-2004-0104647
Dec. 11, 2004  (KR) .................. 10-2004-0104648
Apr. 18, 2005  (KR) .................. 10-2005-0031821

(51) Int. Cl.
*H03M 13/03*   (2006.01)

(52) U.S. Cl. ...................................... 375/265; 714/786
(58) Field of Classification Search ................. 375/146, 375/265, 295; 714/755, 786
See application file for complete search history.

(56) References Cited

U.S. PATENT DOCUMENTS

| | | | |
|---|---|---|---|
| 6,374,386 B1 * | 4/2002 | Kim et al. ............. | 714/786 |
| 7,180,952 B1 * | 2/2007 | Gerlach et al. .......... | 375/259 |
| 2003/0115532 A1 | 6/2003 | Kim et al. | |
| 2004/0037262 A1 * | 2/2004 | Tanada ................. | 370/342 |

FOREIGN PATENT DOCUMENTS

| | | |
|---|---|---|
| DE | 198 15 825 A1 | 10/1999 |
| KR | 2000-0000521 | 1/2000 |
| KR | 2000-0022745 | 4/2000 |
| KR | 10-0318911 | 12/2001 |

OTHER PUBLICATIONS

C. Berrou, et al., "Non-binary convolutional codes for turbo coding", Electronics Letters Jan. 7, 1999 vol. 35 No. 1, pp. 39-40.
International Search Report of International Published Application No. PCT/KR2005/003785 (mailed May 22, 2006).

* cited by examiner

*Primary Examiner* — David B Lugo
(74) *Attorney, Agent, or Firm* — Staas & Halsey LLP

(57) ABSTRACT

An encoding system using a non-binary turbo code and an encoding method thereof is capable of encoding an input signal at a low code rate and at once by spreading the input signal. An input information bit sequence is spread according to the obtained channel code rate and outputting the same in the form of one pair of input sequences, the pair of input sequences is encoded, and a parity bit sequence is generated and an encoded data sequence is generated by multiplexing the parity bit sequence.

11 Claims, 6 Drawing Sheets

[Fig. 1]
PRIOR ART
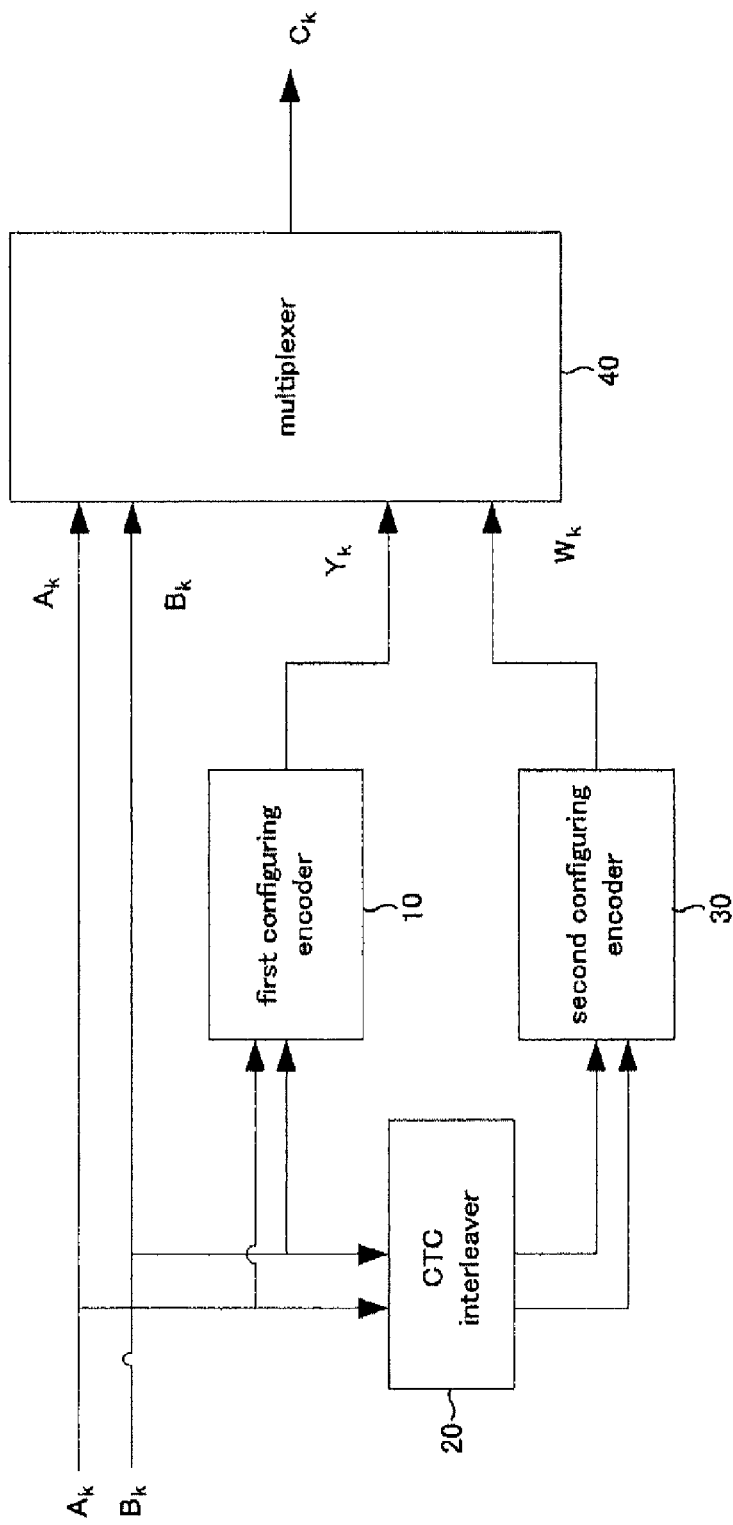

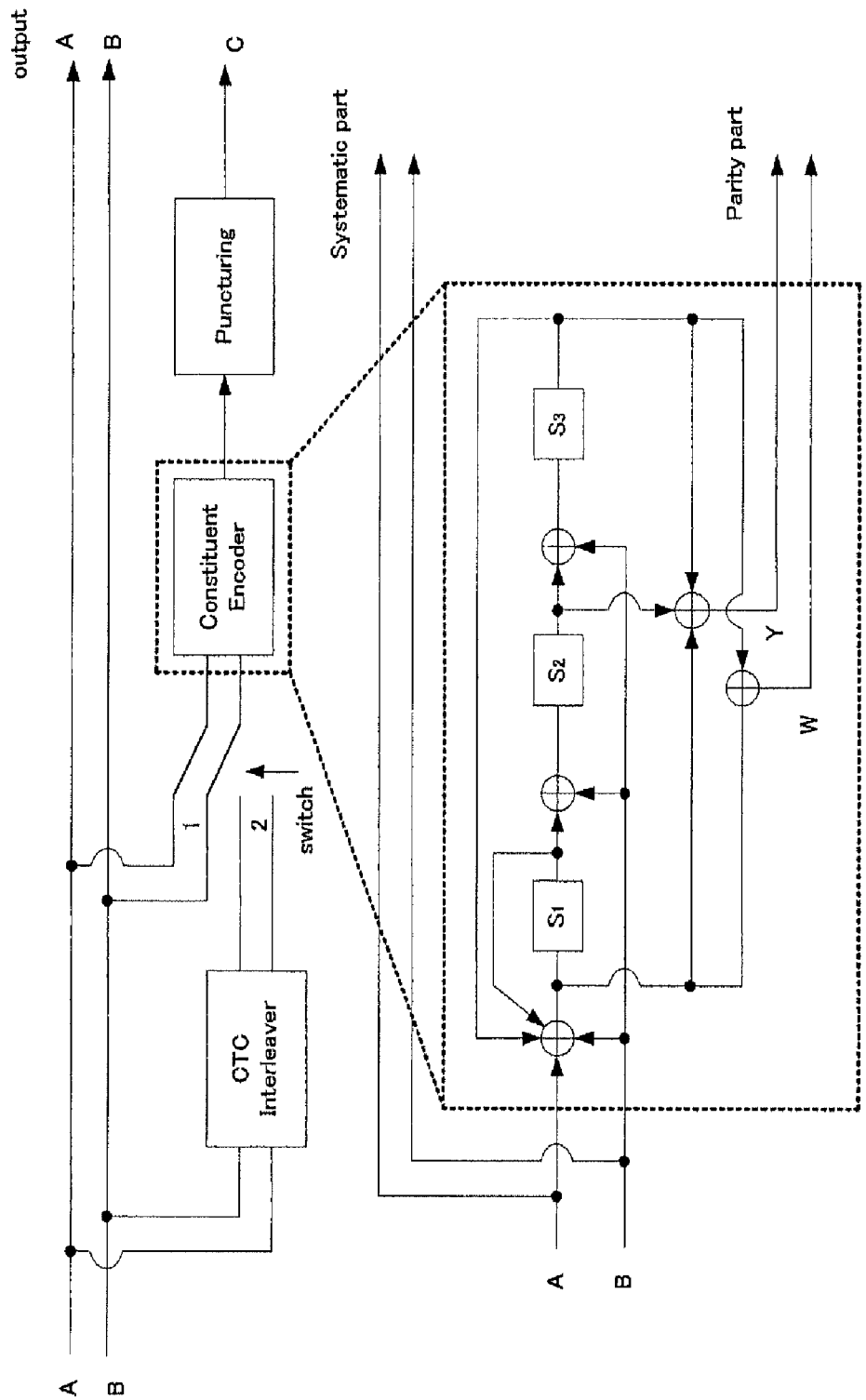
[Fig. 2]
PRIOR ART

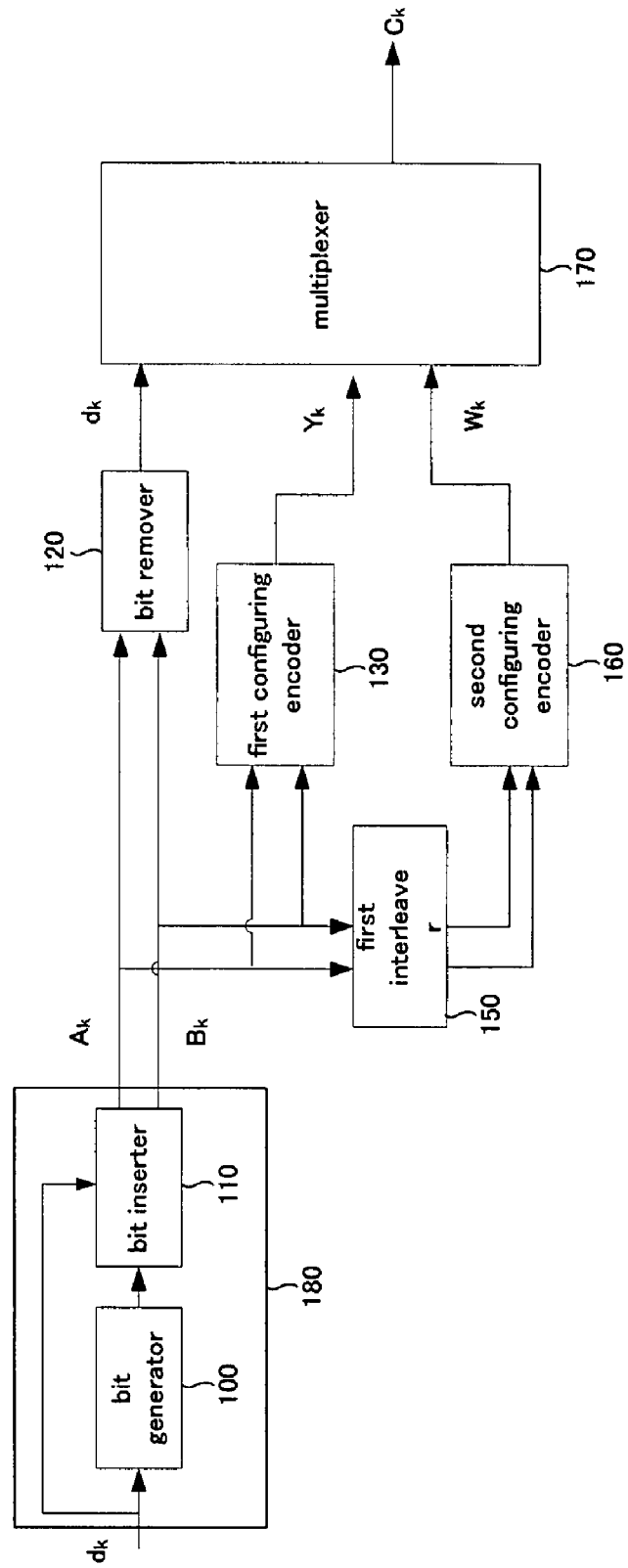
[Fig. 3]

[Fig. 4]
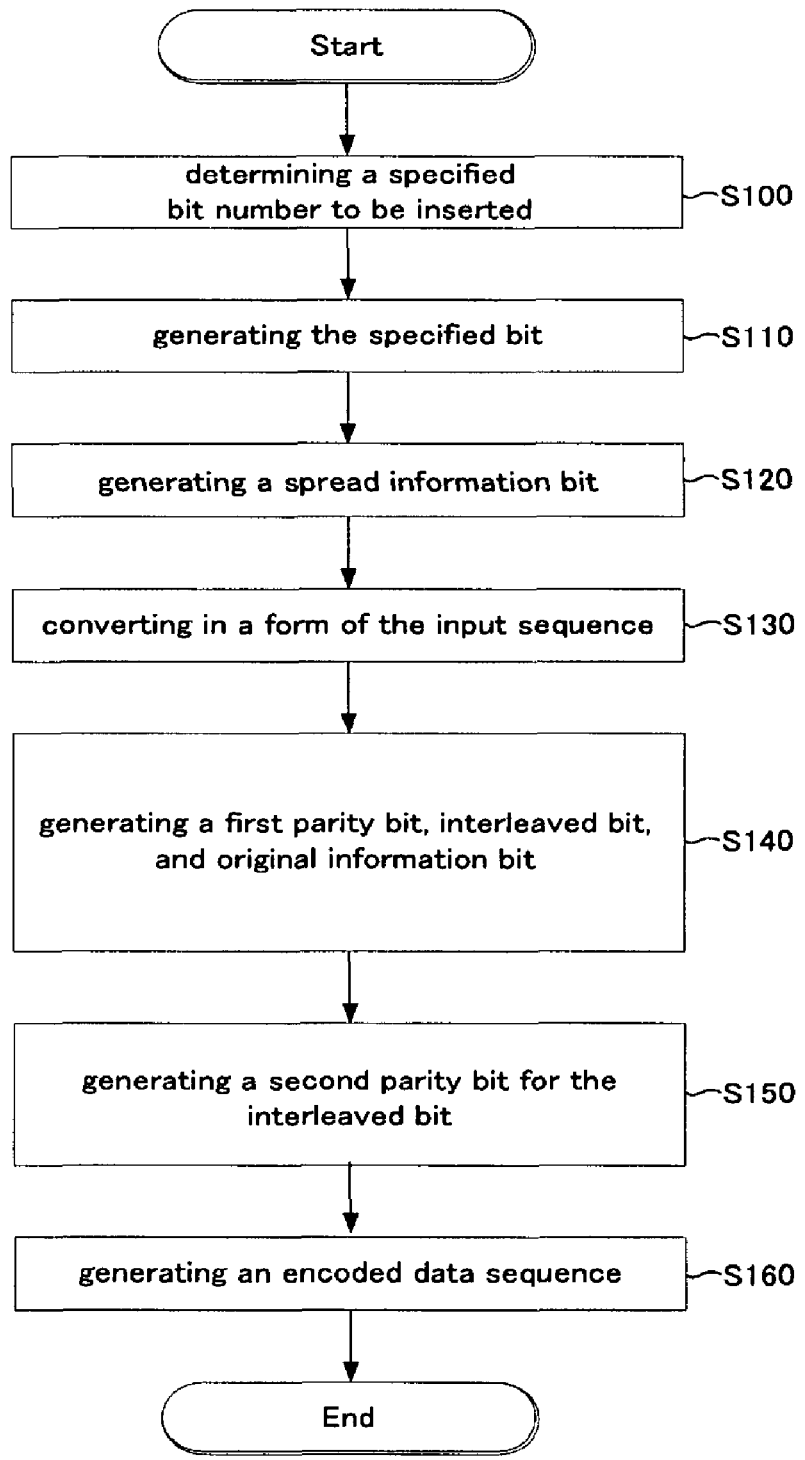

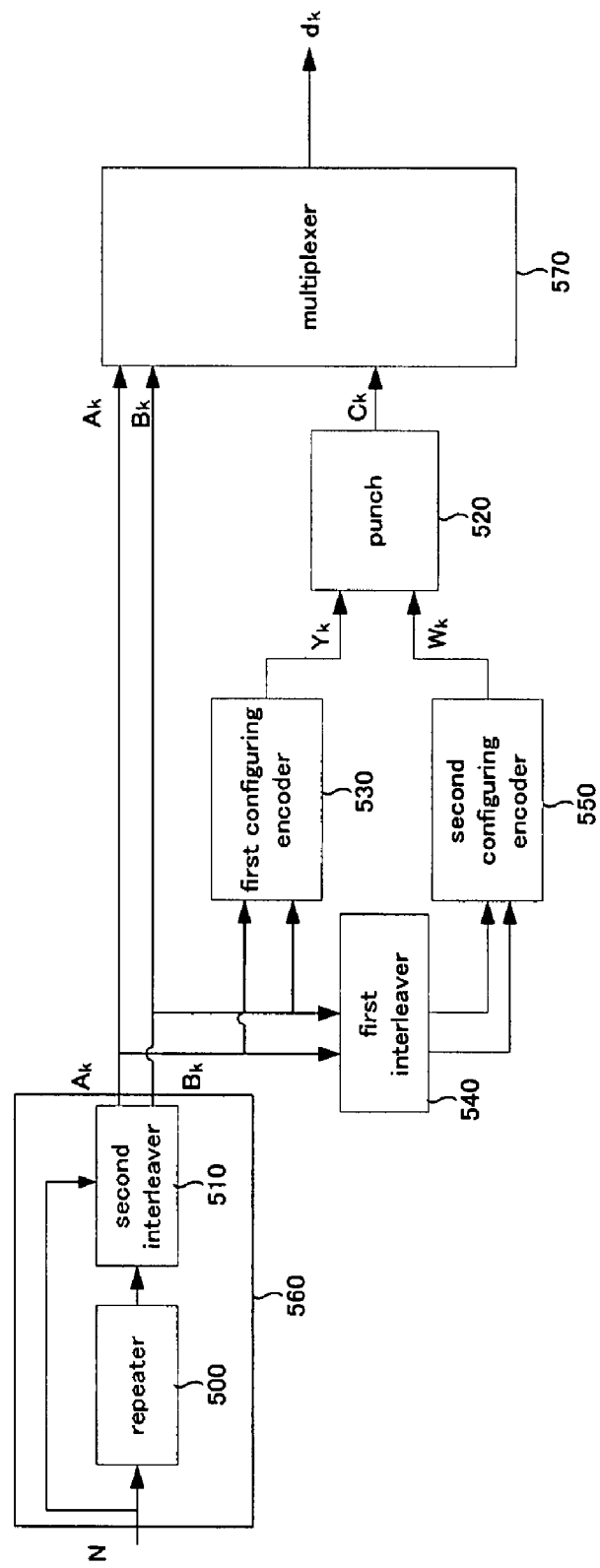
[Fig. 5]

[Fig. 6]
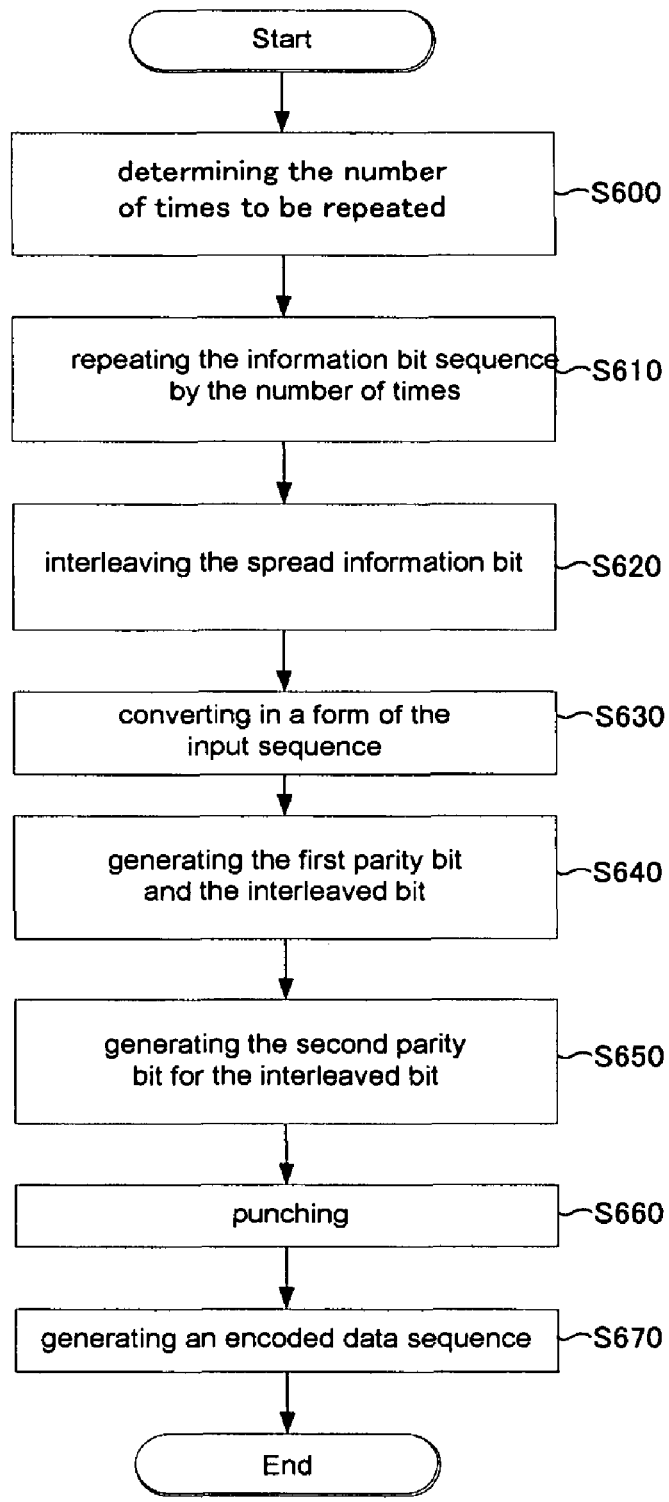

ENCODING SYSTEM USING A NON-BINARY TURBO CODE AND AN ENCODING METHOD THEREOF

CROSS REFERENCE TO RELATED APPLICATIONS

This application claims the benefit under U.S.C. Section 371, of PCT International Publication No. PCT/KR2005/003785, filed Dec. Nov. 9, 2005 and Korean Application No(s). 10-2004-0104648 filed Dec. 11, 2004, 10-2004-0104647 filed Dec. 11, 2004 and 10-2005-0031821 filed Apr. 18, 2005, the contents of which are incorporated herein by reference.

TECHNICAL FIELD

The present invention relates to an encoding system using a non-binary turbo code and an encoding method thereof. More particularly, the present invention relates to an encoding system using a non-binary turbo code capable of encoding input signals at a low code rate and at once by spreading the input signal, and an encoding method thereof.

BACKGROUND ART

A non-binary turbo code is configured to output a parity bit for a plurality of bit input signals, in comparison with an early turbo code configured to output a parity bit for a 1 bit input signal. In order to encode an N-bit information sequence, two N/2-bit-length input sequences A and B are formed, and then the respective input sequences A and B are simultaneously inputted to an encoder. That is, the two types of bits are entirely inputted into the encoder at once. The non-binary turbo code is formed in parallel with two simple recursive systematic convolutional codes (RSCC), which form a parity symbol by utilizing a plurality of input bits at once in this manner.

It is known that the turbo code has superior performance to a convolutional code generally used in a current mobile communication environment for high-speed data. Accordingly, Korean patent application No 10-1999-0034719 (Samsung Electronics Company) entitled "Apparatus for inserting a known bit into a channel encoder and method thereof" discloses that a bit known at both the receiver and transmitter is inserted into a turbo encoder as input values.

FIG. 1 is a block diagram using a non-binary turbo encoder according to the prior art.

A non-binary turbo code shown in FIG. 1 is configured to generate a parity bit for a plurality of input bits. That is, an information bit sequence is divided into two identical length sequences. The respective two information sequences configured in this manner provides simultaneously one bit, that is, two-bit signals into one RSCC.

One pair of the input signals is passed through a first configuring encoder 10 to be given as a first parity bit sequence Yk, and the other pair of the input signals is inputted into a Convolutional Turbo Code (CTC) interleaver 20 to be converted into interleaved signals. The interleaved signals are passed through a second configuring encoder 30 to be given as a second parity bit sequence Wk.

The first parity bit sequence Yk and the second parity bit sequence Wk are encoded in this manner and inputted to a multiplexer 40. In this case, the original information bit sequences Ak and Bk are also inputted in the multiplexer 40. In order to provide various code rates, encoded data can be generated by punching holes in the first parity bit sequence and the second parity bit sequence.

FIG. 2 is a configuration diagram using a non-binary turbo encoder of a code rate of ⅓ according to the prior art.

A method for coding a channel at a low code rate has been recently required so as to avoid a strong interference environment from adjacent cell users in a communication system. Accordingly, as shown in FIG. 2, when the encoder of a code rate of ⅓ is used, the encoder is used two times to generate a code rate of ⅙ to be used, and four times to generate a code rate of 1/12 to be used.

A non-binary turbo encoder with the code rate of ⅓ is generally used, and is obvious to an ordinary skilled person in the art. Accordingly, a detailed expression of the encoder will be omitted.

Since the conventional turbo encoder actually has the code rate of ⅓ and a multiplexer is used to remove all but the desired information bit sequences, a polynomial expression for generating a more parity bit, that is, a feedforward loop is to be added in a communication environment to encode the information bit sequences at a lower code rate than the current code rate of ⅓. Accordingly, there is a problem in that the lower code rate has a less enhanced performance in comparison with the parent code rate of ⅓ due to repeating the encoded information bit sequence.

Also, since the performance depends on the information bit sequence, there is a problem in that the repeated codes have a bad effect when the length of the information bit sequence is short.

The above information disclosed in this Background section is only for enhancement of understanding of the background of the invention and therefore it may contain information that does not form the prior art that is already known in this country to a person of ordinary skill in the art.

DISCLOSURE OF INVENTION

Technical Problem

The present invention has been made in an effort to provide an encoding system using a non-binary turbo code and an encoding method thereof having advantages of encoding input signals at a low code rate and at once by spreading the input signal.

Technical Solution

An exemplary encoding system using a non-binary turbo code according to an embodiment of the present invention includes a bit spreader for spreading an input information bit sequence according to an obtained channel code rate, a first configuring encoder for generating a first parity bit by encoding the information bit sequence spread by the bit spreader, a first interleaver for interleaving the information bit sequence spread by the bit spreader, a second configuring encoder for generating a second parity bit by encoding the spread information bit sequence interleaved by the first interleaver; and a multiplexer for multiplexing the first parity bit, the second parity bit, and the spread information bit sequence to output encoded data.

A bit remover for removing a spread portion from the spread information bit sequence may be further included, such that the spread information bit sequence is recovered into the input information bit sequence to be inputted into the multiplexer.

In addition, the bit spreader may include a bit generator for generating a specified bit by a bit number determined according to the obtained channel and a bit inserter for inserting the specified bit to the input information bit sequence to output the spread information bit sequence.

An exemplary encoding method using a non-binary turbo code according to an embodiment of the present invention includes a) spreading an input information bit sequence according to the obtained channel code rate and outputting the same in a form of one pair of input sequences, b) encoding the pair of input sequences to generate a parity bit sequence, and c) multiplexing the parity bit sequence to generate an encoded data sequence.

Step a) may include 1) determining a bit number to be inserted so as to spread the input information bit sequence according to the obtained channel code rate, 2) generating the specified bit according to the determined bit number, and 3) inserting the specified bit into the input information bit sequence and thus outputting the input information bit sequence in a form of one pair of input sequences.

In addition, step a) may include 1) determining the number of times the input information bit sequence is repeated according to the obtained channel code rate so as to spread the input information bit sequence, and 2) spreading the input information bit sequence according to the determined number of times to be outputted in a form of one pair of input sequences.

ADVANTAGEOUS EFFECTS

According to the exemplary embodiments of the present invention, when an input information bit sequence is spread at a lower code rate than the desired code rate, the input information bit sequence can be encoded at a desired code rate without passing through repeated encoding processes many times.

BRIEF DESCRIPTION OF THE DRAWINGS

FIG. 1 is a configuration diagram using a non-binary turbo encoder according to the prior art.

FIG. 2 is a configuration diagram of a code rate of ⅓ non-binary turbo encoder according to the prior art.

FIG. 3 is a configuration diagram using a non-binary turbo encoder according to a first exemplary embodiment of the present invention.

FIG. 4 is a flowchart of an encoding method according to the first exemplary embodiment of the present invention.

FIG. 5 is a configuration diagram using a non-binary turbo encoder according to a second exemplary embodiment of the present invention.

FIG. 6 is a flowchart of an encoding method according to the first exemplary embodiment of the present invention.

MODE FOR THE INVENTION

An embodiment of the present invention will hereinafter be described in detail with reference to the accompanying drawings.

As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

FIG. 3 is a configuration diagram using a non-binary turbo encoder according to a first exemplary embodiment of the present invention.

As shown in FIG. 3, a non-binary turbo encoder according to a first exemplary embodiment of the present invention includes a bit spreader 180 for spreading an inputted information bit sequence 180, a first configuring encoder 130 and a second configuring encoder 160 for coding the bit sequence, a first interleaver 150 for interleaving the information bit sequence, a bit remover 120 for removing a bit, and a multiplexer 170 for multiplexing the bit sequence.

The bit spreader 180 includes a bit generator 100 for generating a specified bit which both receiving and transmitting ports of the encoder know, and a bit inserter 110 for inserting the specified bit into the original information bit sequence dk.

The bit generator 100 generates the specified bit to be inserted into the original information bit sequence dk based on the previously obtained channel code rate. In this case, the specified bit is inserted into the original information bit sequence dk in the bit inserter 110 to spread the original information bit sequence into spreading information bit sequences Ak and Bk. Also, the specified bit is inserted at predetermined positions that both receiving and transmitting ports of the encoder know, by an interleaving technology.

The first configuring encoder 130 functions to encode the information bit sequence and generate a parity bit Yk. In detail, the first configuring encoder 130 receives the spreading information bit sequence in a form with one pair of input sequences Ak and Bk, encodes the pair of input sequences, and outputs half of all of the bit numbers.

The first interleaver 150 functions to interleave the pair of spreading information bit sequences Ak and Bk outputted from the bit spreader 180 according to a predetermined rule, and converts an order of the information bit.

The second configuring encoder 160 functions to encode and output the interleaved spreading information bit sequence Ak and Bk outputted from the first interleaver 150 into a half of the input bit. In this case, the first configuring encoder 130 and the second configuring encoder 160 may become an RSCC.

The bit remover 120 to output the only original information bit by removing the specified bit generated from the bit generator 100 among the information bit sequence outputted from the bit inserter 110.

The multiplexer 170 functions to receive outputted values Dk, Yk, and Wk from the first configuring encoder 130, the second configuring encoder 160, and the bit remover 120 to multiplex these three signals without further removing and outputting the multiplexed values.

Such constituent elements are combined to form a non-binary turbo encoder. Now, an encoding method according to a first exemplary embodiment of the present invention will be described in detail with reference to FIG. 4.

FIG. 4 is a flowchart of an encoding method according to the first exemplary embodiment of the present invention. As shown in FIG. 4, a channel code rate is obtained from an upper layer (not shown in FIG. 3), and the number of bits to be inserted into the original information bit sequence is determined based on the channel code rate (S100). The specified bit is generated from the bit generator 100 corresponding to the obtained bit number (S110), which both of the transmitter and receiver know. When the specified bit which both of the transmitter and receiver know is inputted into the bit inserter 110, at the bit inserter 110 the specified bit is inserted into N-bit length-information bit sequence dk to form a spreading information bit of "dk+the specified bit", in which the original information bit is spread (S120). A pre-determined position into which the specified bit can be inserted is determined by an interleaving technology that both the receiving and transmitting ports of the encoder know. One pair of input sequences is formed when the input signals are inputted by a 2-bit.

The spreading information bit sequence having the specified bit inserted therein is converted into one pair of the input sequences Ak and Bk (S130) and are generated into the first parity bit, the interleaving bit, and the information bit (S140).

In this case, the first parity bit is an output value of the spreading information bit sequence inputted to the first configuring encoder 130, the interleaving bit is an output value of the spreading information bit sequence inputted to the first interleaver 150, and the original information bit is an output value of the spreading information bit sequence inputted to the bit remover 120. The spreading information bit sequence passes through the first configuring encoder 130 to be formed into the first parity bit sequence Yk corresponding to ½ of the input bit length.

In order to remove the specified bit from among the same input signal as the information bit sequence inputted to the first configuring encoder 130 and the first interleaver 150, the spreading information bit sequence is inputted to the bit remover 120. The interleaving bit generated through S140 is inputted to the second configuring encoder 160 to generate a second parity bit sequence Wk corresponding to the ½ of the bit length (S150).

The first parity bit sequence, the second parity bit sequence and the bit sequence dk are inputted to the multiplexer 170, which corresponds to the original information bit sequence from which the specified bit is removed by the bit remover 120. The multiplexer 170 multiplexes the original information bit sequence, the first parity bit sequence, and the second parity bit sequence, and generates the channel-encoded data sequence Ck to be transmitted. In this case, the multiplexer 170 outputs the encoded data sequence without further removal, since the lower channel code rate has been calculated rather than the parent code rate by inserting the specified bit that both the transmitter and receiver know (S160).

FIG. 5 is a configuration diagram using a non-binary turbo encoder according to a second exemplary embodiment of the present invention.

As shown in FIG. 5, a non-binary turbo encoder according to a second exemplary embodiment of the present invention includes a bit spreader 560 for spreading an input information bit sequence, a first configuring encoder 530 and a second configuring encoder 550 for generating a parity bit by encoding the information bit sequence, a first interleaver 540 for interleaving an information bit sequence, a punch 520 for punching holes in the bit sequence, and a multiplexer 570 for multiplexing the bit sequence.

The bit spreader 560 includes a repeater 500 for repeatedly inputting the information bit sequence N and a second interleaver 510 for interleaving the outputted spread information bit sequence. The repeater functions to insert the identical bit sequence into the front or rear of the input bit sequence and repeatedly spreads the information bit sequence a certain number of times.

The punch 520 punches holes in the information bit sequences Yk and Wk outputted from the first configuring encoder 530 and the second configuring encoder 550 to preserve and transmit a frame at a desired speed, thereby increasing the code rate.

Such constituent elements are combined to form a non-binary turbo encoder. Now, an encoding method according to a second exemplary embodiment of the present invention will be described in detail with reference to FIG. 6.

FIG. 6 is a flowchart of an encoding method according to the first exemplary embodiment of the present invention. As shown in FIG. 6, an input information bit of a predetermined length N is inputted to the repeater 500 to determine the number of repetition (S600).

When the repeated number is determined to be R, the N-bit information bit sequence is spread into R*N bits through the repeated processes (S610).

In the repeated processes (S610), the information bit sequence is repeatedly inserted into the front or rear of the original information bit sequence by the number of times. In this embodiment, for example, the information bit sequence is inserted into the rear of the original information bit sequence. The R*N-bit information bit sequence is inputted into the second interleaver 510 to be interleaved by the spreading information bit (S620) and converted to a form of the input sequence (S630).

The interleaved information bit sequence is converted into the pair of input sequences Ak and Bk to be inputted to the first configuring encoder 530 and simultaneously to the first interleaver 540. The information bit sequence passes through the first configuring encoder 530 in a form of the pair of input sequence to be an (R*N)/2 length first parity bit sequence Yk corresponding to ½ of the length inputted through the XOR process (S640).

The pair of input sequences Ak and Bk having the same length as the information bit sequence inputted to the first configuring encoder 530 are inputted to the first interleaver 540 to be outputted as the interleaved bit sequence (S640). Of course, in this case, the information bit sequence is passed through the XOR process to be generated into an (R*N)/2 length second parity bit sequence Yk (S650). The first parity bit sequence Yk and the second parity bit sequence Wk may be inputted to the punch 540 to be punched (S660). A punched information bit Ck is inputted to the multiplexer 570 along with the spreading information bit sequences Ak and Bk to be transmitted as an encoded data sequence (S670).

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. An encoding system using a non-binary turbo code, comprising:
   a bit spreader for spreading an input information bit sequence according to an obtained channel code rate of an obtained channel;
   a first configuring encoder for encoding the information bit sequence spread by the bit spreader to generate a first parity bit;
   a first interleaver for interleaving the information bit sequence spread by the bit spreader; a second configuring encoder for generating a second parity bit by encoding the spread information bit sequence interleaved by the first interleaver; and
   a multiplexer for multiplexing the first parity bit, the second parity bit, and the spread information bit sequence to output encoded data
   wherein the bit spreader includes:
   a bit generator for generating a specified bit by a bit number determined according to the obtained channel code rate; and
   a bit inserter for inserting the specified bit into the input information bit sequence to output the spread information bit sequence.

2. The encoding system using a non-binary turbo code of claim 1, further comprising a punch for punching holes in the first parity bit and the second parity bit to be outputted to the multiplexer.

3. The encoding system using a non-binary turbo code of claim 1, wherein the information bit sequence is outputted form the bit spreader as a spread information bit sequence in the form of one pair of input sequences.

4. The encoding system using a non-binary turbo code of claim 1, wherein the first configuring encoder generates the first parity bit sequence corresponding to ½ the length of the spread information bit sequence in the form of one pair of input sequences, and the second configuring encoder generates the second parity bit sequence corresponding to ½ the length of the spread information bit sequence in the form of one pair of input sequences interleaved by the first interleaver.

5. An encoding system using a non-binary turbo code, comprising:
   a bit spreader for spreading an input information bit sequence according to an obtained channel code rate;
   a first configuring encoder for encoding the information bit sequence spread by the bit spreader to generate a first parity bit;
   a first interleaver for interleaving the information bit sequence spread by the bit spreader;
   a second configuring encoder for generating a second parity bit by encoding the spread information bit sequence interleaved by the first interleaver;
   a multiplexer for multiplexing the first parity bit, the second parity bit, and the spread information bit sequence to output encoded data; and
   a bit remover for removing a spread portion from the spread information bit sequence such that the spread information bit sequence is recovered into the input information bit sequence to be inputted into the multiplexer.

6. An encoding system using a non-binary turbo code, comprising:
   a bit spreader for spreading an input information bit sequence according to an obtained channel code rate;
   a first configuring encoder for encoding the information bit sequence spread by the bit spreader to generate a first parity bit;
   a first interleaver for interleaving the information bit sequence spread by the bit spreader;
   a second configuring encoder for generating a second parity bit by encoding the spread information bit sequence interleaved by the first interleaver; and
   a multiplexer for multiplexing the first parity bit, the second parity bit, and the spread information bit sequence to output encoded data,
   wherein the bit spreader includes:
   a repeater for repeatedly outputting the input information bit sequence a predetermined number of times; and
   a second interleaver for interleaving the information bit sequence outputted from the repeater.

7. An encoding method using a non-binary turbo code, comprising:
   a) spreading an input information bit sequence according to an obtained channel code rate of an obtained channel and outputting the input information bit sequence in the form of one pair of input sequences;
   b) encoding the pair of input sequences to generate a parity bit sequence; and
   c) multiplexing the parity bit sequence to generate an encoded data sequence,
   wherein a) comprises:
   1) determining a bit number to be inserted so as to spread the input information bit sequence according to the obtained channel code rate;
   2) generating the specified bit by the determined bit number; and
   3) inserting the specified bit into the input information bit sequence and thus outputting the input information bit sequence in the form of one pair of input sequences.

8. The encoding method using a non-binary turbo code of claim 7, further comprising, at 2), spreading by repeatedly inserting the input information bit sequence by the number of times determined at 1) to the front or rear of the input information bit sequence to be outputted in the form of one pair of input sequences.

9. The encoding method using a non-binary turbo code of claim 7, further comprising, at b):
   1) Interleaving the one pair of input sequences, outputting the interleaved sequences and encoding the pair of input sequences to generate a first parity bit; and
   2) encoding the interleaved pair of input sequences to generate a second parity bit.

10. The encoding method using a non-binary turbo code of claim 9, wherein 1) is repeated for the spread information bit sequences.

11. The encoding method using a non-binary turbo code of claim 9, wherein 1) is repeated for the rest of information bit sequences except the input information bit sequence among the spread information bit sequences.

* * * * *